United States Patent [19]

Van Vaals

[11] Patent Number: 4,876,507
[45] Date of Patent: Oct. 24, 1989

[54] METHOD OF AND DEVICE FOR AUTOMATIC PHASE CORRECTION OF COMPLEX NMR SPECTRA

[75] Inventor: Johannes J. Van Vaals, Eindhoven, Netherlands

[73] Assignee: U.S. Philips Ltd., New York, N.Y.

[21] Appl. No.: 270,914

[22] Filed: Nov. 14, 1988

[30] Foreign Application Priority Data

Nov. 12, 1987 [NL] Netherlands ............ 8702700

[51] Int. Cl.[4] ............................................. G01R 33/20
[52] U.S. Cl. ...................................... 324/307; 324/309
[58] Field of Search ............... 324/300, 307, 309, 310, 324/311, 312, 313, 314

[56] References Cited

U.S. PATENT DOCUMENTS

| | | | |
|---|---|---|---|
| 4,613,949 | 9/1986 | Glover | 324/309 |
| 4,628,262 | 12/1986 | Maudsley | 324/309 |
| 4,680,546 | 7/1987 | Dumoulin | 324/307 |
| 4,695,798 | 9/1987 | Brandes | 328/187 |
| 4,736,160 | 4/1988 | Sano | 324/307 |

*Primary Examiner*—Michael J. Tokar

*Attorney, Agent, or Firm*—Thomas A. Briody; Jack E. Haken; Jack D. Slobod

[57] ABSTRACT

A method is proposed for the automatic correction of phase errors in NMR spectra. The phase errors are interalia due to deficiencies of the NMR hardware, the time-shifted sampling of a magnetic resonance signal after the appearance thereof. The phase correction is performed by first determining peak locations in a modulus spectrum determined from the complex spectrum and by determining the phases in the peak locations, after which the phase in the peak locations are fitted to a predetermined polynomial by means of a least-squares optimization procedure. The coefficients of the polynomial are thus defined. Subsequently, the NMR spectrum is point-wise corrected by means of the phase polynomial determined. The proposed method can be simply implemented in a NMR device; no severe requirements are imposed as regards the signal-to-noise ratio and the resolution of the spectrum. In practical situations an NMR spectrum usually comprises many spectral lines. Therefore, the method is not susceptible to the effects of overlapping spectral lines.

20 Claims, 3 Drawing Sheets

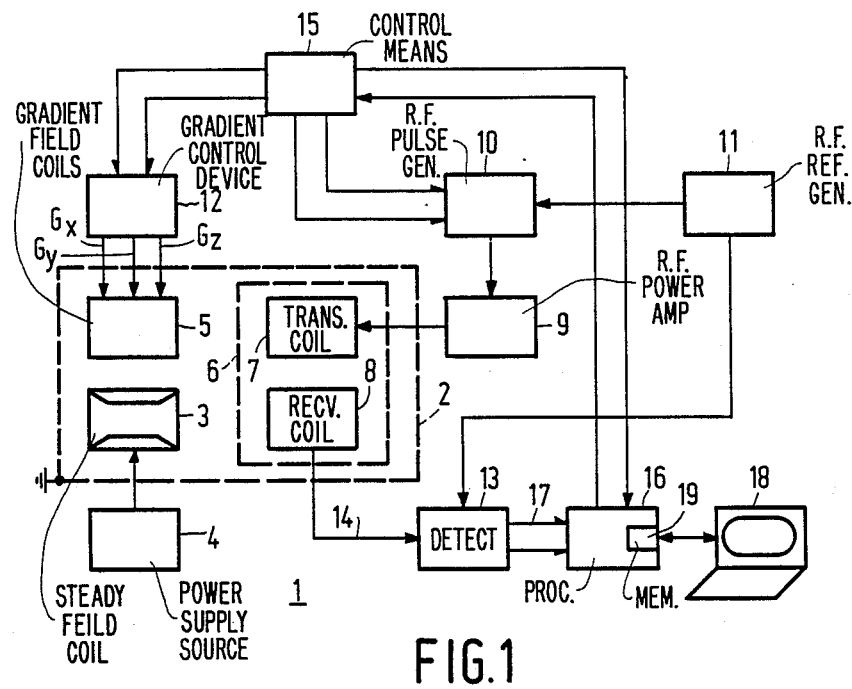
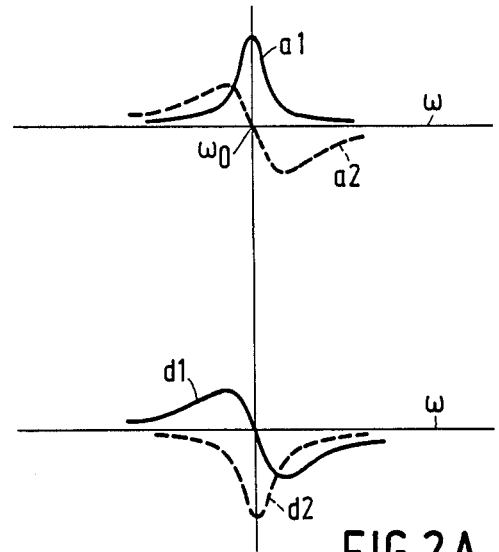
FIG.2A
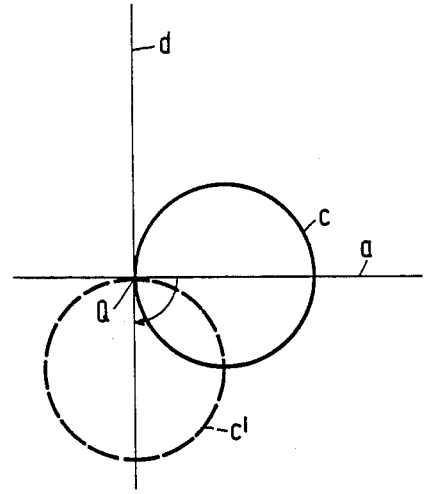
FIG.2B

METHOD OF AND DEVICE FOR AUTOMATIC PHASE CORRECTION OF COMPLEX NMR SPECTRA

BACKGROUND OF THE INVENTION

1. Field of the Invention

The invention relates to a method of correcting a complex resonance spectrum obtained from sampling values of at least one resonance signal by Fourier transformation, which resonance signals are generated by means of R.F. electromagnetic pulses in an object situated in a steady, uniform magnetic field, there being determined peak locations in the complex spectrum and phase values in the peak locations.

The invention also relates to a device for determining a complex magnetic resonance spectrum of at least a part of an object, which device comprises means for generating a steady magnetic field, means for applying magnetic field gradients on the steady, uniform magnetic field, means for transmitting R.F. electromagnetic pulses in order to excite resonance signals in the object, means for receiving and detecting the excited resonance signals and means for generating sampling values from the detected resonance signals, and also comprises programmed means for determining, using Fourier transformation, the complex magnetic resonance spectrum from the sampling values, which programmed means are also suitable for determining peak locations in the complex spectrum and phase values in the peak locations.

2. Description of the Prior Art

A method of this kind is known from the article by C. H. Sotak et al. in "Journal of Magnetic Resonance", Vol. 57, pp. 453-462, 1984. Said article describes a non-iterative automatic phase correction for a complex magnetic resonance spectrum containing phase errors. The phase errors are due inter alia to deficiencies of the NMR device, for example misadjustment of the means for receiving and detecting the resonance signals or the finite width of the R.F. electromagnetic pulses; phase errors occur notably also due to incorrect timing. For example, when the resonance signal (the so-called FID signal) which occurs immediately after the R.F. electromagnetic pulse is sampled, in practice the instant at which the FID signal commences will hardly ever coincide with the instant at which a first sampling value is obtained. Across the complex spectrum, therefore, frequency-independent (zero-order) as well as frequency-dependent (first order and higher order) phase errors will occur. In said article a method is proposed for correcting zero-order and first-order phase errors by way of a linear phase correction across the complex spectrum. The complex spectrum can be considered to be a real and an imaginary spectrum (absorption mode and dispersion mode, respectively). Using a so-called DISPA (plot of dispersion versus absorption), an image is indicated for a single Lorentzian spectral line. When the Lorentzian spectral line is ideal (i.e. when there is no phase shift), an image is produced in the form of a circle which serves as a reference image for non-ideal Lorentzian lines. Using a DISPA, in principle the phase error of non-ideal Lorentzian lines can be determined with respect to an ideal Lorentzian line. The linear phase correction disclosed in the cited article utilizes this phenomenon in order to determine the frequency-dependent phase error. First a power spectrum is determined from the complex spectrum and peak locations of suitable resonance lines are determined from said power spectrum. Subsequently, the phase of a peak nearest to the centre of the spectrum is determined by means of DISPA. Using this phase, the zero-order phase error is corrected. Subsequently, the phase of the other peaks is determined by means of DISPA and, using the phases of the other peaks determined, a linear phase variation is estimated as well as possible in order to approximate the first-order phase error. Using the approximation found for the zero-order and first-order phase error, the complex spectrum is ultimately phase-corrected point by point. The known method imposes requirements as regards peak separation; peaks in the spectrum which are comparatively near to one another cannot be used. Furthermore, there must be at least two peaks which are comparatively remote from one another in the spectrum; if this is not the case, it will be necessary to create two remote peaks in the spectrum by the addition of an agent. By using linear phase correction in the known method, for example only phase shifts will be compensated for which are caused by the time shifted measurement of the resonance signals. Inevitably present phase errors due to other causes, will not be covered.

It is an object of the invention to provide a method which does not have the described drawbacks.

To achieve this, a method in accordance with the invention is characterized in that coefficients of a frequency-dependent phase function extending across the complex spectrum are approximated from the phase values in the peak locations in accordance with a predetermined criterion, after which the complex spectrum is corrected by means of the frequency-dependent phase function determined. The frequency-dependent phase function may be a polynomial whose degree may be predetermined. It is alternatively possible to define the power of the polynomial during the approximation. As a result, any phase-dependency can be approximated. The method in accordance with the invention is based on the recognition of the fact that the phases in the peak locations of the complex spectrum must be zero in the absence of phase errors; the absorption mode signal is then maximum and the dispersion mode signal is zero. When the coefficients of the frequency-dependent phase function have been determined, the complex spectrum can be corrected by means of the frequency-dependent phase function determined by point-wise correcting the real and the imaginary part thereof as a function of the frequency.

A version of a method in accordance with the invention is characterized in that the peak locations are derived from a modulus spectrum which is determined from the complex spectrum. The peak locations can be suitably determined from the modulus spectrum because this spectrum is not influenced by the phase errors occurring.

A version of a method in accordance with the invention in which peak parameters are determined in the peak locations during the determination of the peak locations is characterized in that in the case of overlapping peaks the overlapping peaks are corrected by means of the peak parameters determined. The peak parameters determined for overlapping peaks can be used for correcting neighbouring overlapping peaks by utilizing the fact that the real and the imaginary part must satisfy Lorentzian formulas; an excessive contribution to a line can be subtracted from a neighbouring line. If such a correction were not performed, ultimately a spectrum which has not been completely corrected could be obtained. It is to be noted that such a correction can be dispensed with in the case of spectra comprising numerous lines. When a wide background is present in the spectrum, the parameters of the wide background (which may be considered to be a wide spectral line) can be determined; using the method described for correcting overlapping lines, the parameters determined for the wide background can be used to eliminate the effect of the wide background.

Moreover, a model of the complex spectrum can be calculated on the basis of the peak locations and peak parameters determined. The phase of the complex spectrum can then be corrected in the peak locations by means of the frequency-dependent phase function determined and in frequencies outside the peak locations by means of a weighted phase from the phases of the peak locations. Using the model, the degree of contribution of the peaks to a frequency outside the peak locations is determined in order to determine weighting factors for the weighted phase. Notably when a very strong peak is present in the spectrum, for example a water peak in proton spectra, it may be necessary to use such a somewhat refined correction.

The invention will be described in detail hereinafter whith reference to a drawing; therein:

BRIEF DESCRIPTION OF THE DRAWING

FIG. 1 diagrammatically shows a device in accordance with the invention,

FIG. 2A shows a Lorentzian spectral line,

FIG. 2B shows a so-called DISPA of a Lorentzian spectral line,

DETAILED DESCRIPTION OF THE PREFERRED EMBODIMENTS

Figure 3:
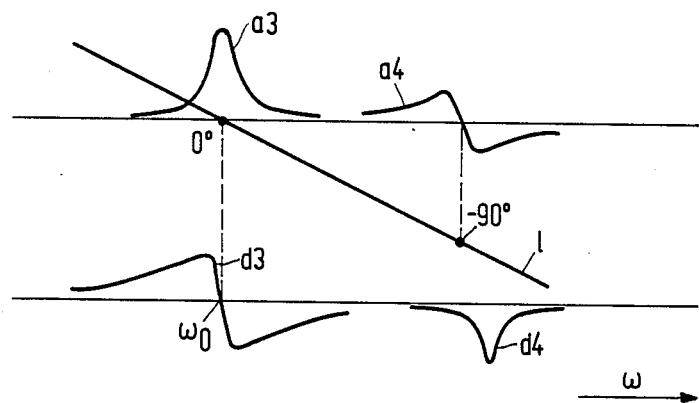
FIG. 3 shows a decomposition of two resonance lines from a magnetic resonance spectrum.

FIG. 1 diagrammatically shows a device 1 in accordance with the invention which comprises, arranged within a shielded space 2, magnet coils 3 for generating a steady, uniform magnetic field (the means for generating a steady magnetic field), gradient coils 5 (the means for applying magnetic field gradients), and a transmitter and receiver coil system 6, comprising a transmitter coil 7 and a receiver coil 8 (the means for transmission and reception). When the magnet coils 3 are formed by a resistance magnet, they are powered by a DC power supply source 4. When the magnet coils are formed by a permanent magnet, the DC power supply source 4 will of course be absent. The magnet coils can also be formed by a superconducting magnet. The transmitter coil 7 is coupled, via an R.F. power amplifier 9 and an R.F. generator 10, to a reference generator 11. The R.F. generator 10 serves to generate an R.F. electro-magnetic pulse for the excitation of nuclear spins in the object situated within the magnet coils 3. The gradient coils 5, are controlled by a gradient coil control device 12 and serve to generate magnetic field gradients which are superposed on the steady, uniform magnetic field. Generally three gradients can be generated their field direction coincides with the direction of the steady, uniform magnetic field and their respective gradient directions z, y and x extend mutually perpendicularly.

The receiver coil 8 serves to receive magnetic resonance signals of nuclear spins generated in the object by the transmitter coil 7 and is coupled to a detector 13 (the means for detection) for detecting the magnetic resonance signals 14 in quadrature detection. The detector 13 is coupled to the reference generator 11 and comprises low-pass filters and analog-to-digital converters (the means for generating sampling values) for digitizing the resonance signals received and detected. Control means 15 serve for the control and timing of the R.F. generator 10 and the gradient coil control device 12. The device 1 also comprises processing means 16 for processing the digitized resonance signals 17. The processing means 16 are coupled to the control means 15. For the display of spectra formed by means of programmed means in the processing means 16, the processing means are also coupled to a display unit 18. The processing means 16 comprise a memory 19 for the storage of the programmed means and for the storage of the non-corrected and corrected spectra and other data formed by means of the programmed means. The processing means 16 are generally formed by a complex computer system comprising a variety of many facilities for coupling to peripheral equipment.

FIG. 2A shows a Lorentzian spectral line. An absorption line a1 is plotted as a function of the frequency $\omega$ in the upper graph and a dispersion line d1 is plotted as a function of the frequency $\omega$ in the lower graph of FIG. 2A. An object (not shown) is arranged within the magnet coils 3 so as to be exposed to a steady, uniform magnetic field $B_o$ generated in the magnet coils. Under the influence of the field $B_o$ a small excess of nuclear spins present in the object will be directed in the direction of the field $B_o$. From a macroscopic point of view the small excess of nuclear spins directed in the direction of the field $B_o$ is considered as a magnetization M of the object or as a slight polarization of the nuclear spins present in the object. With respect to a coordinate system which is stationary to an observer, the magnetization M performs a precessional motion about the magnetic field $B_o$: $\omega_o$ = gamma. $B_o$, where gamma is the gyromagnetic ratio and $\omega_o$ is the resonance frequency of the nuclear spins. The object arranged in the magnetic field $B_o$ is subsequently irradiated with an R.F. electromagnetic pulse generated in the transmitter coil 7 by the R.F. generator 10. The steady magnetic field $B_o$ defines a z-axis of an xyz cartesian coordinate system which rotates about the z-axis thereof at the angular frequency $\omega_o$ of the R.F. electromagnetic pulse (a coordinate system rotating in the same direction). Nuclear spins having a Larmor frequency equal to the angular frequency $\omega_0$ will be synchronized with the rotating coordinate system. Before and after the application of the R.F. electro-magnetic pulse the magnetization M will be stationary in the rotating coordinate system. The rotation in the rotating coordinate system of the magnetization M will be proportional to the pulse duration and the pulse amplitude of the R.F. electromagnetic pulse. A component of the magnetization M projected onto the xy plane of the rotating coordinate system, being coincident with the x axis, forms the dispersion component and a component which coincides with the y axis of the rotating coordinate system forms the absorption component of the magnetization M. When the power of the applied R.F. electromagnetic pulse is so small that no saturation occurs, the description of the absorption component as a function of the frequency is in conformity with the Lorentzian spectral line a1, a Fourier transform of an exponential function. The dispersion component is the associated component. The absorption line a1 and the dispersion line d1 are related via a Hilbert transformation: $d1 = a1 \otimes (2\pi/\omega)$, where $\otimes$ represents the convolution operation (for a detailed description of absorption and dispersion, see: Fourier Transform NMR Spectroscopy, D. Shaw, published by Elsevier, 1976, pp. 33). The exponential function describes the decreasing of the magnetization M projected onto the xy plane (the so-called transverse magnetization). This generally known relaxation phenomenon is also described in said manual. The absorption line a1 (being out of phase with respect to the excitation frequency) is of most interest to a spectroscopist: the absorption of energy by the system of nuclear spins (object), the behaviour of the magnetization as a function of the frequency. When the object contains not only water-bound protons (with which synchronization takes place) but also fat-bound protons which are present in a different chemical environment, a water and fat spectrum will be obtained after Fourier transformation of an NMR resonance signal. In the absorption spectrum thereof two (dominant) resonance lines occur. It will be evident that when the object also contains protons situated in other chemical environments, the spectrum will exhibit more resonance peaks. For example, when double phase-sensitive detection is used, in which case the detector comprises a first phase-sensitive detector (not shown in detail) whereto the reference signal generated by means of the reference generator 11 is applied as a reference signal and a second phase-sensitive detector whereto the 90° phase-shifted reference signal is applied, the two digital signals 17 will become available after signal sampling by the analog-to-digital converters in the detector 13, which signals serve to determine the absorption mode spectrum and the dispersion mode spectrum therefrom by Fourier transformation in the processing means 16. The dispersion mode spectrum can be considered to be the real part of the transverse magnetization as a function of the frequency and the absorption mode spectrum can be considered to be the imaginary part thereof. The NMR spectrum can be considered to be the pulse response of the nuclear spin system (object). When phase errors occur in the NMR device 1, they will have an effect on the spectrum. Broken lines in FIG. 2A indicate the effect of a 90° phase shift on the absorption line a1 and on the dispersion line d1; it can be simply established that: $a2 = d1$ and $d2 = -a1$. In said article by Sotak correction formules are given for the linear correction of spectra containing phase errors (on page 453 of the Sotak article).

FIG. 2B shows a so-called DISPA of a Lorentzian spectral line. Pages 453–454 of said article by Sotak describe that the plotting of the dispersion d as a function of the absorption a results in a circle c in the case of an ideal Lorentzian spectral line. The diameter of the circle c is equal to the absorption peak of the absorption line a1. The article also describes the effect of a phase error on the circle c. In FIG. 2B the reference c' denotes a DISPA circle where a 90° phase shift has occurred. Sotak demonstrates that the circle c is rotated with respect to the origin 0 for arbitrary phase errors.

FIG. 3 shows a decomposition of two resonance lines from a magnetic resonance spectrum. It is assumed that the object to be measured contains water and other materials containing protons (in this case one material, for example fat). The upper graph of FIG. 3 shows a disturbed absorption spectrum and the lower graph shows a disturbed dispersion spectrum. Therein, a3 is the absorption peak of the water (the reference generator 11 is tuned to the Larmor frequency of protons in water) and a4 denotes the disturbed absorption peak of fat. The references d3 and d4 denote the corresponding respective dispersion peaks. The Larmor frequency of protons in fat deviates from that of protons in water; in this respect: $\omega = \text{gamma} \cdot (1 - \sigma) \cdot B_o$, where $\sigma$ is a shielding constant (the effect of the so-called chemical shift due to the difference in shielding of protons by electrons). The phase error for fat ($-90°$ in the example shown) is caused, for example in that the resonance signal is sampled only some time after $t = 0$ (centre of the R.F. electromagnetic pulse); this often occurs due to instrumental deficiencies; this effect can occur also in the case of so-called spin echo measurements and other measurements, but in that case it will be due, for example to the non-coincidence of a first signal sample and the maximum of an echo signal. This shifted measurement has no effect on the water peak in the present example (is synchronized with the rotating coordinate system and with the frequency of the reference generator 11); however, it has an effect on the fat peak (in this case a 90° phase shift). It will be evident that the absorption spectrum is disturbed thereby. From the absorption and dispersion spectrum measured, Sotak determines a power spectrum and peak locations therefrom. DISPA is used to determine the phase of a peak in order to execute a zero order phase correction. Sotak subsequently determines the phase of the other peaks by means of DISPA and estimates a linear phase variation therefrom. Finally, Sotak performs a linear phase correction by means of the formulas stated on page 453 of the cited article. In FIG. 3 the line 1 represents a linear phase variation across the spectrum; the phase error is zero for $\omega = \omega_0$. When there are a number of causes of phase errors, other than the shifted measurement (for example, hardware causes), the phase error will not vary linearly across the spectrum. In the case of a wide background in the spectrum, the method in accordance with Sotak will require a separate correction. In accordance with the invention, using the programmed means stored in the memory 19, the processing means 16 first determine a modulus spectrum from the absorption spectrum and the dispersion spectrum measured by means of the NMR device 1. From the modulus spectrum there are determined peak locations with associated parameters, such as: peak amplitude, peak width at half amplitude and peak position. In a number of peak locations the phase is determined according to:

$$\phi_i = \text{arctg Im}/\text{Re},$$

where $\phi_i$ is the phase of the peak having the frequency $\omega = \omega_i$, and Re and Im are the real part and the imaginary part, respectively, of the complex magnetic resonance spectrum in $\omega = \omega_i$. Subsequently, a polynomial approximation is executed:

$$\phi = \phi_0 + \phi_1 \cdot f_i + \phi_2 \cdot (f_i)^2 + $$

where $f_i$ is the frequency in the peak i and where $\phi_0, \phi_1, \phi_2, \ldots$ are the coefficients to be determined. The polynomial is adapted as well as possible, for example by means of a least-squares optimization procedure (for example, as described on page 817–819 of Advanced Engineering Mathematics, E. Kreyszig, 4th Edition, Wiley 1979), to the phases $\phi_i$ in the peaks. Alternatively, an as correct as possible phase polynomial can be determined by iteration of coefficients. Finally, using the polynomial determined the complex spectrum (absorption spectrum and dispersion spectrum) will be pointwise corrected (i.e. for a number of data points in the frequency domain) by means of the formules stored in the programmed means:

$$Re'(f) = Re(f) \cdot \cos(\phi[f]) + Im(f) \cdot \sin(\phi[f]) \text{ and}$$
$$Im'(f) = -Re(f) \cdot \sin(\phi[f]) + Im(f) \cdot \cos(\phi[f]$$

where $Re'(f)$ is the corrected real part of the complex spectrum, $Im'(f)$ is the corrected imaginary part of the spectrum, $Re(f)$ is the real part and $Im(f)$ is the imaginary part of the non-corrected complex spectrum. The above correction with the determined frequency-dependent phase function can also be performed only in the peak locations and a different strategy can be adopted for intermediate points. A model of the spectrum is formed on the basis of the peak locations and the peak parameters. In an intermediate point in the model the contribution of various peaks is calculated and the phase is corrected thereby in a weighted manner. For example, when a contribution of a first peak amounts to 80% and that of a second peak to 20%, phase correction in the intermediate point is realized with 80% of the phase according to the frequency-dependent phase function determined in the first peak and with 20% of the phase according to the frequency-dependent phase function determined in the second peak.

Figure 4:
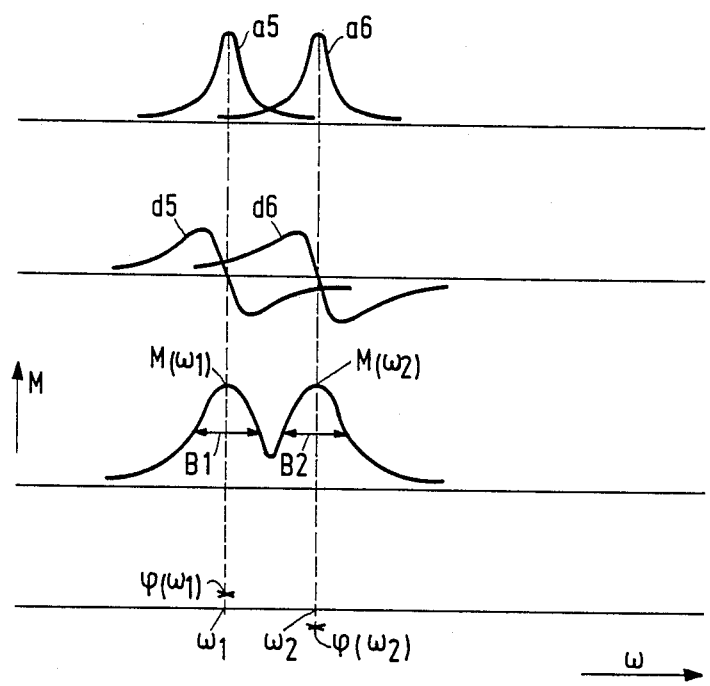
FIG. 4 shows a decomposition of two overlapping resonance lines from a magnetic resonance spectrum.

FIG. 4 shows a decomposition of two overlapping resonance lines from a magnetic resonance spectrum. For a clear description of the effect of overlapping in relation to the invention it is assumed that no phase errors are involved. In the upper graph of FIG. 4 two absorption lines a5 and a6 are shown as a function of the frequency $\omega$. In the graphs therebelow two associated dispersion lines d5 and d6 are shown and a modulus graph M which is determined from the absorption lines a5 and a6 and from the dispersion lines d5 and d6 by means of the programmed means. Below the modulus graph M the associated phase in the peak locations $\omega_1$ and $\omega_2$ is determined, i.e. $\phi[\omega_1]$ and $\phi[\omega_2]$, respectively. In the absence of overlapping, $\phi[\omega_1]$ and $\phi[\omega_2]$ will be zero when no phase errors are present. If a phase correction were still performed, of course it would be uncalled for. Using further parameters determined in the overlapping peaks, such as peak amplitudes $M[\omega_1]$, $M[\omega_2]$ and pulse widths at half amplitude, B1 and B2, the effect of (strongly) overlapping lines can be eliminated prior to the execution of the phase correction. Using the parameters of a neighbouring line, the phase of the adjacent line determined is corrected. When the spectrum contains many spectral lines (a situation which frequently occurs in practice), the correction for overlapping lines can usually be omitted. In that case phase contributions in the peak positions are averaged out. In the case of a poor signal-to-noise ratio, an excessively large number of peaks (also a number due to noise) would probably be involved in the phase correction. Because of the random nature of noise, noise effects would be averaged out. In that case it is not necessary to take it into account noise (this is the case for most measurements; by repeating the measurement, at the expense of the overall measuring time, and averaging the resonance signals, the signal-to-noise ratio can be improved). The execution of the phase correction can also be preceded by filtering in the time domain in order to reduce the effect of noise on the phase correction and to facilitate the determination of spectral peaks in a modulous graph determined from the filtered signal.

Figure 5:
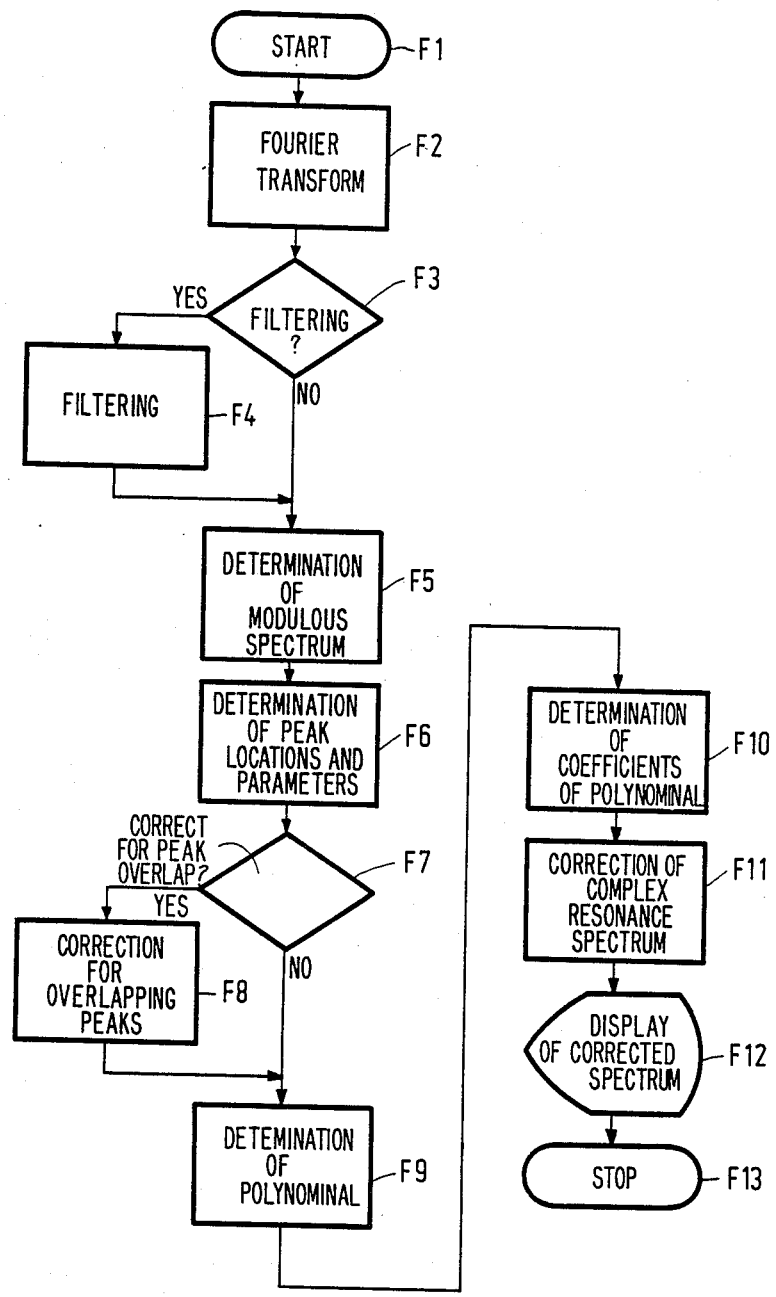
FIG. 5 shows a flow chart illustrating the method.

FIG. 5 shows a flow chart illustrating the method in accordance with the invention. The method in accordance with the invention is stored in the form of programmed means in the memory 19 and is executed in the processing means 16. It is assumed hereinafter that a magnetic resonance measurement has been performed by means of the NMR device 1 (magnetic resonance measurements are generally known and are described in many publications: in chapter 5 and chapter 6 of said book by Shaw). As from F1 the programmed means will be described hereinafter. In F2 a real spectrum $Re(\omega)$ (u mode) and an imaginary spectrum $Im(\omega)$ (v mode) are determined by Fourier transformation by means of the programmed means. In F3 a choice can be made as regards the filtering in advance or not of the complex spectrum obtained. When a filtering operation F4 is performed, the programmed means execute an inverse Fourier transformation on the complex spectrum $Re(\omega)$ and $Im(\omega)$, filter the result obtained by means of inverse Fourier transformation, using (for example) an exponential digital filter, and finally perform a Fourier transformation on the filtered result. The filtered spectrum is stored in the memory 19. Subsequently, in F5 the modulus spectrum is determined from the complex spectrum, filtered or not. In F6 peak positions $\omega_i$ are determined and also the phases $\phi_i$ therein, and possibly further peak parameters such as peak amplitudes $M(\omega_i)$ and peak widths at half amplitude Bi. In F7 it can be decided whether or not a correction will be performed in advance for overlapping spectral lines. When a correction is performed in advance, it takes place in F8 on the basis of $\omega_i$, $M(\omega_i)$ and Bi for neighbouring peaks. In F9 the polynomial is defined whereby the least-squares optimization procedure is performed. In F10 the coefficients $\phi_0$, $\phi_1$, $\phi_2$, ... of the polynomial are determined by means of the least-squares optimization procedure. In F11 the real spectrum $Re(\omega)$ and the imaginary spectrum $Im(\omega)$ are corrected with the phase $\phi(\omega)$ determined from the polynomial. In F12 the corrected and the non-corrected spectrum are displayed on the display unit 18. In F13 the programmed means continue with other tasks to be performed by means of the NMR device 1. The blocks in FIG. 5 are designated as follows:

F1 Start
F2 Fourier transformation
F3 Filtering (yes/no)?
F4 Filtering
F5 Determination of modulus spectrum
F6 Determination of peak locations and peak parameters
F7 Correction for overlapping peaks (yes/no)?
F8 Correction for overlapping peaks
F9 Determination of polynomial
F10 Determination of coefficients of polynomial
F11 Correction of complex resonance spectrum
F12 Display of corrected spectrum
F13 Stop Not all nuclear spins in the object need be excited. For example, a part of the object (volume of interest) can be excited in order to display a corrected spectrum thereof. In that case so-called volume-selective excitation will take place. This is realized by exciting the gradient coils 5 ($G_x$, $G_y$ and $G_z$) in a given sequence by means of the gradient coil control device 12 and by transmitting an R.F. electromagnetic pulse by means of the transmitter coil 7. For a detailed description of volume-selective excitation reference is made to, for example an article by Luyten and Den Hollander "1H MR Spatially Resolved Spectroscopy", Magnetic Resonance Imaging, Vol. 4, pp. 237–239, 1986. It will be evident that the described method is not restricted to proton spectra and that, for example $^{13}C$, $^{31}p$, etc. spectra, high-resolution spectra, etc. can also be corrected. Spectra of organic and/or anorganic materials can be corrected. The method can be combined with many known NMR pulse sequences for spectroscopy.

What is claimed is:

1. A method of correcting phase errors in a complex magnetic resonance spectrum obtained by Fourier transformation from samples of at least one resonance signal excited in an object situated in a steady, uniform magnetic field by means of R.F. electromagnetic pulses, said complex magnetic resonance spectrum having peak locations and phase values in the peak locations, said method comprising: determining the coefficients of a frequency-dependent phase function extending across the complex spectrum from the phase values in selected peak locations in such a manner that said function meets a predetermined best fit criterion, and correcting phase errors in the complex spectrum by means of the frequency-dependent phase function determined.

2. The method as claimed in claim 1, characterized in that the frequency-dependent phase function is a polynomial.

3. The method as claimed in claim 2, characterized in that the predetermined criterion is a least-squares criterion.

4. The method as claimed in claim 1, characterized in that the frequency-dependent phase function is a polynomial.

5. The method as claimed in claim 1, 2, 3 or 4 further comprising deriving the peak locations from a modulus spectrum which is determined from the complex spectrum.

6. The method as claimed in claim 1, 2, 3 or 4 further comprising deriving the peak locations are from a power spectrum which is determined from the complex spectrum.

7. The method as claimed in any one of claims 1, 2, 3 or 4 in which peak parameters are determined in the peak locations during the determination of the peak locations, characterized in that in the case of overlapping peaks the overlapping peaks are corrected by means of the peak parameters determined.

8. The method as claimed in claim 7, characterized in that the peak parameters are the peak amplitude, the peak width at half peak amplitude, and the peak position.

9. The method as claimed in claim 7, characterized in that the peak locations are derived from a modulus spectrum which is determined from the complex spectrum.

10. The method as claimed in claim 7, characterized in that the peak locations are derived from a power spectrum which is determined from the complex spectrum.

11. A device for determining a complex magnetic resonance spectrum of at least a part of an object, which device comprises means for generating a steady magnetic field, means for applying magnetic field gradients on the steady, uniform magnetic field, means for transmitting R.F. electromagnetic pulses in order to excite resonance signals in the object, means for receiving and detecting the excited resonance signals and means for generating samples from the detected resonance signals, and also comprises programmed means for determining, using Fourier transformation, the complex magnetic resonance spectrum from the samples, which programmed means are also means for determining peak locations in the complex spectrum and phase values of said complex spectrum in the peak locations, characterized in that the programmed means are also means for determining coefficients of a frequency-dependent phase function by approximation from the phase values in selected peak locations according to a predetermined best fit criterion and for subsequently correcting phase errors in the complex spectrum by means of the frequency-dependent phase function determined.

12. The device as claimed in claim 11, characterized in that the frequency dependent phase function is a polynomial.

13. The device as claimed in claim 12, characterized in that the predetermined criterion is a least-squares criterion.

14. The device as claimed in claim 11, characterized in that the frequency-dependent phase function is a polynomial.

15. The device as claimed in claim 11, 12, 13 or 14, characterized in that the peak locations are derived from a modulus spectrum which is determined from the complex spectrum.

16. The device as claimed in claim 11, 12, 13 or 14 characterized in that the peak locations are derived from a power spectrum which is determined from the complex spectrum.

17. The device as claimed in claim 11, 12, 13 or 14 in which peak parameters are determined in the peak locations during the determination of the peak locations, characterized in that in the case of overlapping peaks the overlapping peaks are corrected by means of the peak parameters determined.

18. The device as claimed in claim 17, characterized in that the peak parameters are the peak amplitude, the peak width at half peak amplitude, and the peak position.

19. The device as claimed in claim 17, characterized in that the peak locations are derived from a modulus spectrum which is determined from the complex spectrum.

20. The device as claimed in claim 17, characterized in that the peak locations are derived from a power spectrum which is determined from the complex spectrum.

* * * * *